(12) United States Patent
Lee

(10) Patent No.: US 7,378,743 B2
(45) Date of Patent: May 27, 2008

(54) CIRCUIT BOARD AND ELECTRONIC ASSEMBLY

(75) Inventor: Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 190 days.

(21) Appl. No.: 11/453,163

(22) Filed: Jun. 13, 2006

(65) Prior Publication Data
US 2007/0158797 A1 Jul. 12, 2007

(30) Foreign Application Priority Data
Jan. 11, 2006 (TW) ............................. 95101036 A

(51) Int. Cl.
*H01L 23/48* (2006.01)
(52) U.S. Cl. ........................ 257/773; 257/666
(58) Field of Classification Search ................ 257/773, 257/775, 666, 676, 784, 692
See application file for complete search history.

(56) References Cited

U.S. PATENT DOCUMENTS 7,211,887 B2 * 5/2007 Channabasappa et al. .. 257/691
2002/0024129 A1 * 2/2002 Hirahara et al. ............ 257/691
2005/0082645 A1 * 4/2005 Lee et al. .................... 257/666
2006/0043542 A1 * 3/2006 Corisis ........................ 257/666
2006/0118924 A1 * 6/2006 Corisis et al. ............... 257/666

* cited by examiner

*Primary Examiner*—S. V Clark
(74) *Attorney, Agent, or Firm*—J.C. Patents

(57) ABSTRACT

A circuit board suitable for being electrically connected to a chip package is provided. The chip package has a chip pad and a plurality of inner leads. The circuit board includes at least one patterned conductive layer and at least one insulating layer. The patterned conductive layer has at least one first pad and at least one second pad. The first pad has an extension part and is suitable for being electrically connected to the chip pad. The second pad is suitable for being electrically connected to one end of at least one of the inner leads, while the other end of the inner lead suitable for being electrically connected to the second pad has a projection at least partially overlapping the extension part on the patterned conductive layer. Moreover, the patterned conductive layer is disposed outside the insulating layer.

16 Claims, 3 Drawing Sheets

US 7,378,743 B2

CIRCUIT BOARD AND ELECTRONIC ASSEMBLY

CROSS-REFERENCE TO RELATED APPLICATION

This application claims the priority benefit of Taiwan application serial no. 95101036, filed on Jan. 11, 2006. All disclosure of the Taiwan application is incorporated herein by reference.

BACKGROUND OF THE INVENTION

1. Field of Invention

The present invention relates to a wiring board and an electronic assembly, and more particularly, to a circuit board and an electronic assembly including a chip package and a circuit board.

2. Description of Related Art

In general, a conventional wiring board used for carrying and being electrically connected to a plurality of electronics includes a package substrate and a circuit board. The wiring board is constituted by alternately stacking a plurality of patterned conductive layers with a plurality of insulating layers. The patterned conductive layers are, for example, defined on a copper foil layer through a lithograph and etching process. The insulating layers are respectively disposed between the adjacent patterned conductive layers for isolating the patterned conductive layers. Moreover, the overlapping patterned conductive layers are electrically connected to each other through conductive vias.

As for the circuit board, a chip package can be disposed on its surface to form an electronic assembly. The chip package and the patterned conductive layer on the surface of the circuit board are electrically connected to each other, and electrical signal propagation can be achieved through the inner circuit of the circuit board.

FIG. 1A is a schematic top view of a conventional electronic assembly. FIG. 1B is a schematic cross-sectional view of FIG. 1A along the line A-A. Referring to FIGS. 1A and 1B, a conventional electronic assembly 100 includes a chip package 110 in a quad flat no-lead (QFN) package configuration (referred to QFN package for short hereafter), a circuit board 120, and a solder mask layer 130. The QFN package 110 includes a chip 112, a lead frame 114, a plurality of bonding wires 116, and an encapsulant 118. The chip 112 has an active surface 112a and a plurality of bonding pads 112b disposed on the active surface 112a. The lead frame 114 has a chip pad 114a and a plurality of inner leads 114b, wherein the chip 112 is disposed on the chip pad 114a. The chip pad 114a and the inner leads 114b are electrically connected to the bonding pads 112b via the bonding wires 116. The encapsulant 118 at least encapsulates the chip 112, the bonding wires 116, and a part of the lead frame 114.

The QFN package 110 is disposed on the circuit board 120. The circuit board 120 has two patterned conductive layers 122, an insulating layer 124, and a plurality of conductive vias 126. The insulating layer 124 is disposed between the two patterned conductive layers 122. The conductive vias 126 pass through the insulating layer 124 so as to electrically connect the two patterned conductive layers 122. As seen from FIGS. 1A and 1B, the patterned conductive layer 122 electrically connected to the QFN package 110 has a ground pad 122a and a plurality of signal lines 122b (only one signal line is shown in FIGS. 1A and 1B), such that the chip pad 114a of the QFN package 110 is disposed on the ground pad 122a, and one end of the signal line 122b is electrically connected to one of the inner leads 114b of the QFN package 110. Moreover, a solder mask layer 130 is disposed on the patterned conductive layer 122 electrically connected to the QFN package 110. The solder mask layer 130 has an opening 132 for exposing a part of the signal line 122b and the ground pad 122a.

However, under high-frequency signal transmission, the induced inductance generated by the bonding wires 116 aggravates the impedance mismatch between the signal line 122b and the inner leads 114b electrically connected thereto; thus, the signal transmission quality between the signal line 122b and the inner leads 114b electrically connected thereto is thereby deteriorated.

SUMMARY OF THE INVENTION

The present invention provides a circuit board suitable for being electrically connected to a chip package. The chip package has a chip pad and a plurality of inner leads. The circuit board includes a patterned conductive layer and an insulating layer. The patterned conductive layer has at least one first pad and at least one second pad. The first pad has an extension part and is suitable for being electrically connected to the chip pad. The second pad is suitable for being electrically connected to one end of at least one of the inner leads, while the other end of the inner lead suitable for being electrically connected to the second pad has a projection at least partially overlapping the extension part on the patterned conductive layer. Moreover, the patterned conductive layer is disposed outside the insulating layer.

The present invention provides an electronic assembly, which includes a chip package and a circuit board. The chip package includes a chip, a lead frame, a plurality of bonding wires, and an encapsulant. The chip has an active surface and a plurality of bonding pads disposed on the active surface. The lead frame has a chip pad and a plurality of inner leads. The chip is disposed on the chip pad, while the chip pad and some of the inner leads are electrically connected to the bonding pads via the bonding wires respectively. The encapsulant at least encapsulates the chip, the bonding wires, and a part of the lead frame. Furthermore, the chip package is disposed on the circuit board. The circuit board includes a patterned conductive layer and an insulating layer. The patterned conductive layer has at least one first pad and at least one second pad. The first pad has an extension part and is electrically connected to the chip pad. The second pad is electrically connected to one end of at least one of the inner leads, while the other end of the inner lead electrically connected to the second pad has a projection at least partially overlapping the extension part on the patterned conductive layer. The patterned conductive layer is disposed outside the insulating layer.

In order to make the aforementioned features, and advantages of the present invention comprehensible, a plurality of embodiments accompanied with figures are particularly described in detail below.

DESCRIPTION OF EMBODIMENTS

The First Embodiment

Figure 1A:
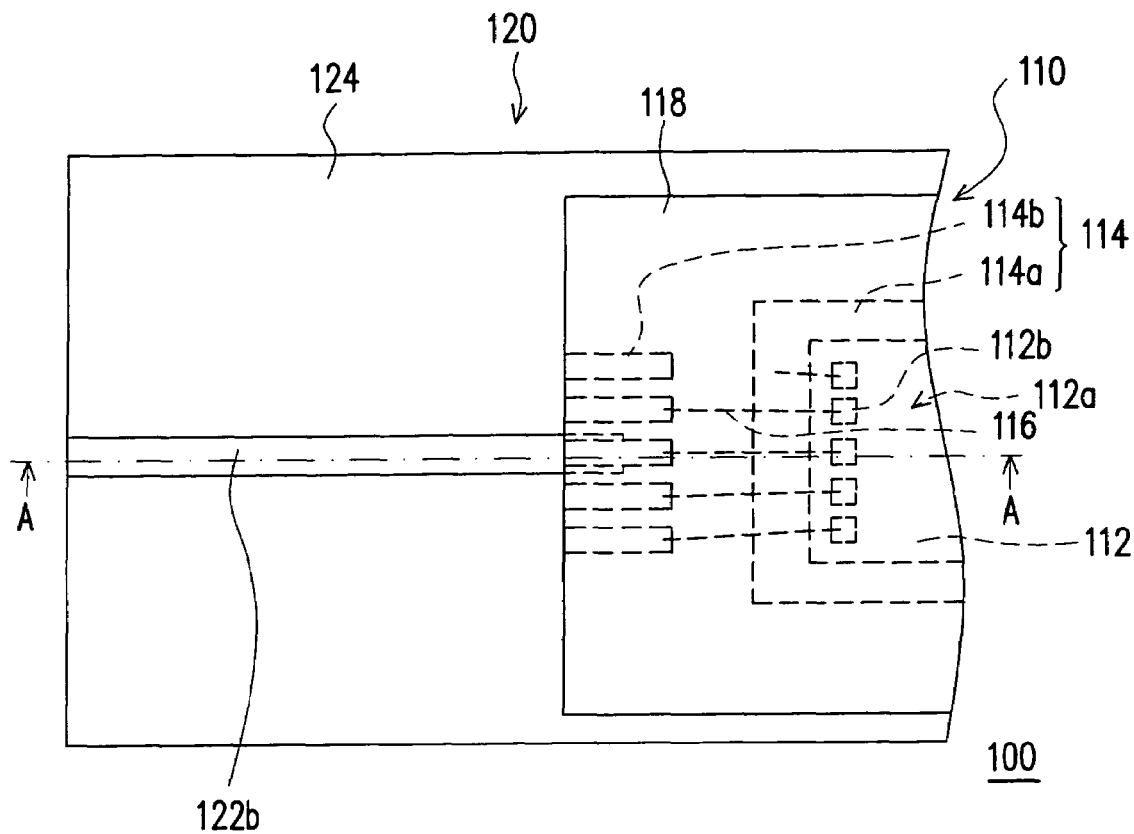
FIG. 1A is a schematic top view of a conventional electronic assembly.
Figure 1B:
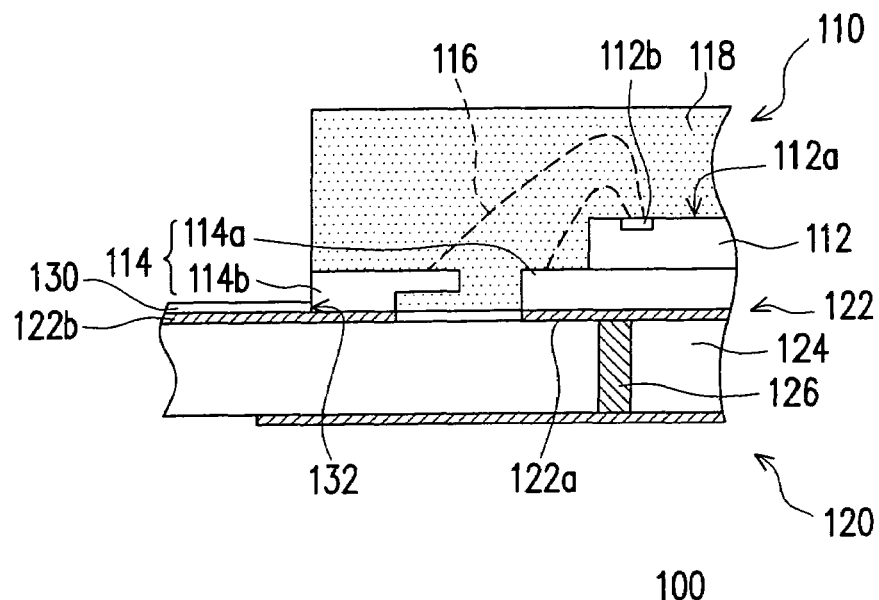
FIG. 1B is a schematic cross-sectional view of FIG. 1A along the line A-A.
Figure 2A:
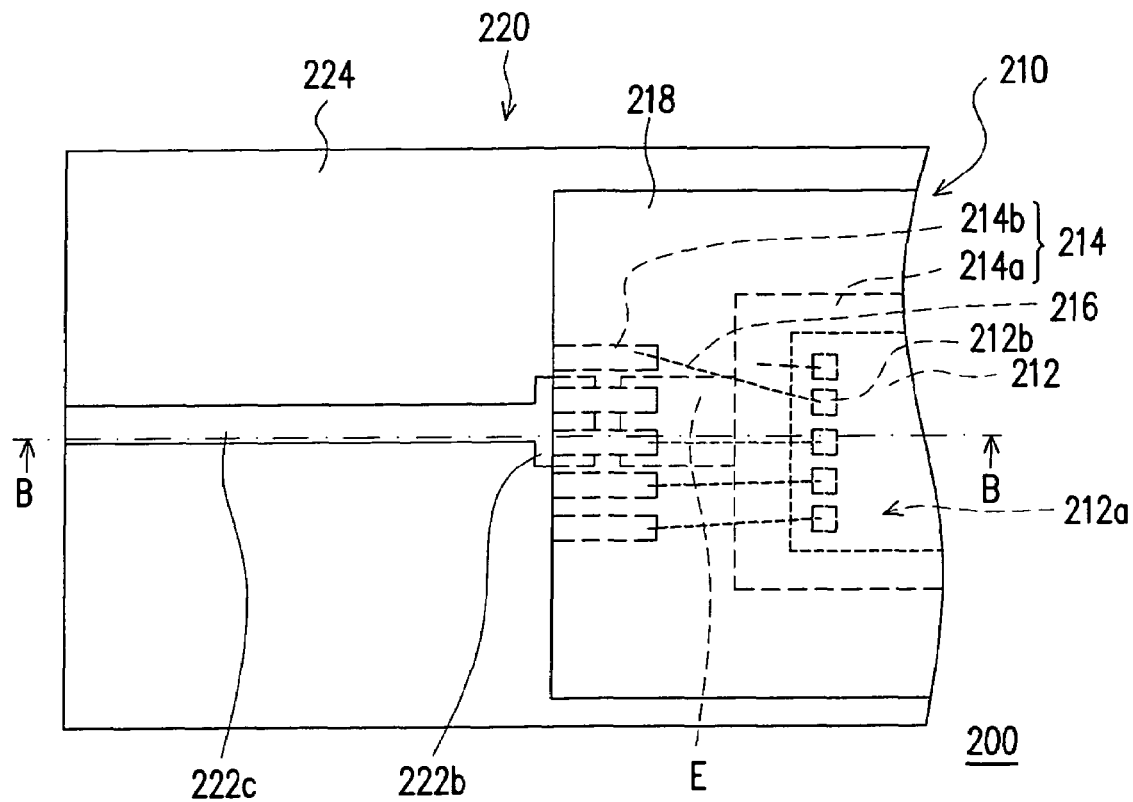
FIG. 2A is a schematic top view of an electronic assembly according to the first embodiment of the present invention.
Figure 2B:
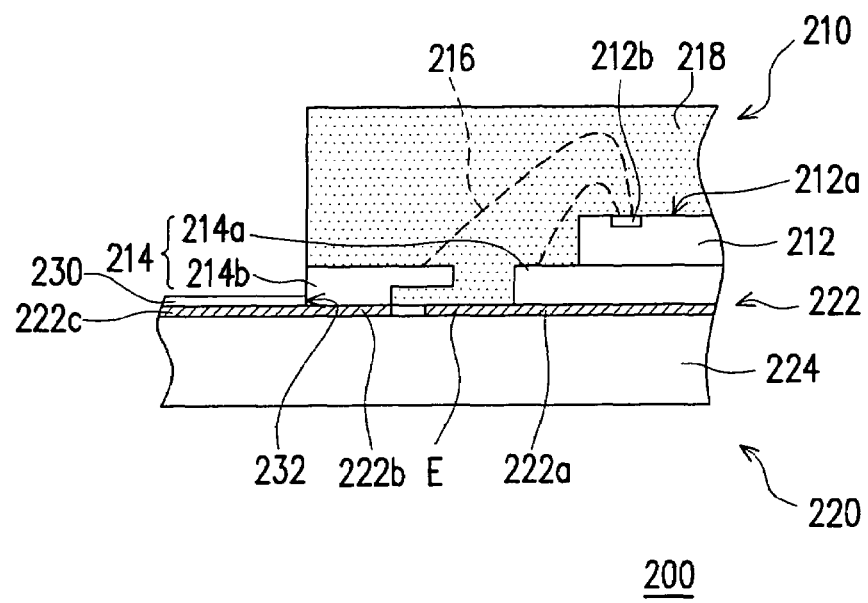
FIG. 2B is a schematic cross-sectional view of FIG. 2A along the line B-B.

FIG. 2A is a schematic top view of an electronic assembly according to the first embodiment of the present invention. FIG. 2B is a schematic cross-sectional view of FIG. 2A along the line B-B. Referring to FIGS. 2A and 2B, an electronic assembly 200 of the first embodiment includes a chip package 210 and a circuit board 220. The chip package 210, for example, a QFN package, includes a chip 212, a lead frame 214, a plurality of bonding wires 216 (only five bonding wires are schematically shown in FIG. 2A), and an encapsulant 218. The chip 212 has an active surface 212a and a plurality of bonding pads 212b (only five bonding pads are schematically shown in FIG. 2A) on the active surface 212a. The lead frame 214 has a chip pad 214a and a plurality of inner leads 214b (only five inner leads are schematically shown in FIG. 2A). The chip 212 is disposed on the chip pad 214a. The chip pad 214a and some of the inner leads 214b are electrically connected to the bonding pads 212b via the bonding wires 216 respectively. The encapsulant 218 encapsulates the chip 212, the bonding wires 216, and a part of the lead frame 214.

Further, the chip package 210 is disposed on the circuit board 220. The circuit board 220 includes at least one patterned conductive layer 222 and at least one first insulating layer 224. The patterned conductive layer 222 has at least one first pad 222a and at least one second pad 222b, wherein the first pad 222a is, for example, a ground pad; the second pad 222b is, for example, a signal pad. The first pad 222a has an extension part E and is electrically connected to the chip pad 214a, such that the chip 212 is located above the first pad 222a. Besides, the second pad 222b is electrically connected to one end of two adjacent inner leads 214b, and the other end of the two adjacent inner leads 214b electrically connected to the second pad 222b has a projection at least partially overlapping the extension part E on the patterned conductive layer 222. In other words, the extension part E extends beneath the other end of the two adjacent inner leads 214b electrically connected to the second pad 222b. Moreover, the electronic assembly 200 further includes a second insulating layer 230, e.g., a solder mask layer, disposed on the patterned conductive layer 222 as shown in FIG. 2B. The second insulating layer 230 has at least one opening 232 for exposing the first pad 222a and the second pad 222b.

The patterned conductive layer 222 is disposed outside the first insulating layer 224. The patterned conductive layer 222 is, for example, defined on the copper foil layer through the lithograph and etching process. The material of the first insulating layer 224 is, for example, glass fiber epoxy resin (FR-4) or epoxy resin. It should be mentioned that in the first embodiment, each of the patterned conductive layer 222 and the first insulating layer 224 comprises one single layer, but they may also be of a multilayer structure. For example, the patterned conductive layers 222 and the first insulating layers 224 stack with each other to form a multilayer structure, wherein the first insulating layers 224 can be respectively disposed between the adjacent patterned conductive layers 222 for isolating the patterned conductive layers 222. Besides, the overlapping patterned conductive layers 222 can be electrically connected to each other through at least one conductive via (not shown). As such, the circuit board 220 of the first embodiment is used as an example, and is not intended to limit the present invention.

In the first embodiment, the patterned conductive layer 222 includes at least one transmission line 222c with one end being electrically connected to the second pad 222b. Moreover, one of the two adjacent inner leads 214b electrically connected to the second pad 222b is electrically connected to one of the bonding pads 212b via one of the bonding wires 216. In other words, only one of the two adjacent inner leads 214b electrically connected to the second pad 222b is used to transmit signals between the chip 212 and the transmission line 222c.

It should be mentioned that the second pad 222b is electrically connected to one end of one of the inner leads 214b, and the other end of the inner lead 214b electrically connected to the second pad 222b has a projection at least partially overlapping the extension part E on the patterned conductive layer 222. Besides, the inner lead 214b electrically connected to the second pad 222b can be electrically connected to one of the bonding pads 212b via one of the bonding wires 216, but the feature is not shown in the figures.

In view of the above, when the electronic assembly 200 of the first embodiment is used to transmit high-frequency signals, for example, in a high-frequency region of 1-5 Giga-Hz, the impedance mismatch caused by the induced inductance generated by the bonding wires 216 can be compensated by the induced capacitance between the extension part E of the first pad 222a and the two adjacent inner leads 214b electrically connected to the transmission line 222c, thereby improving the signal transmission quality between the transmission line 222c and the two adjacent inner leads 214b electrically connected thereto. Moreover, the second pad 222b of the circuit board 220 can be further appropriately connected to one inner lead 214b or a plurality of adjacent inner leads 214b of the chip package 210 in the present invention, so as to generate proper induced capacitance values through designing the dimension and shape of the extension part E.

The Second Embodiment

Figure 3:
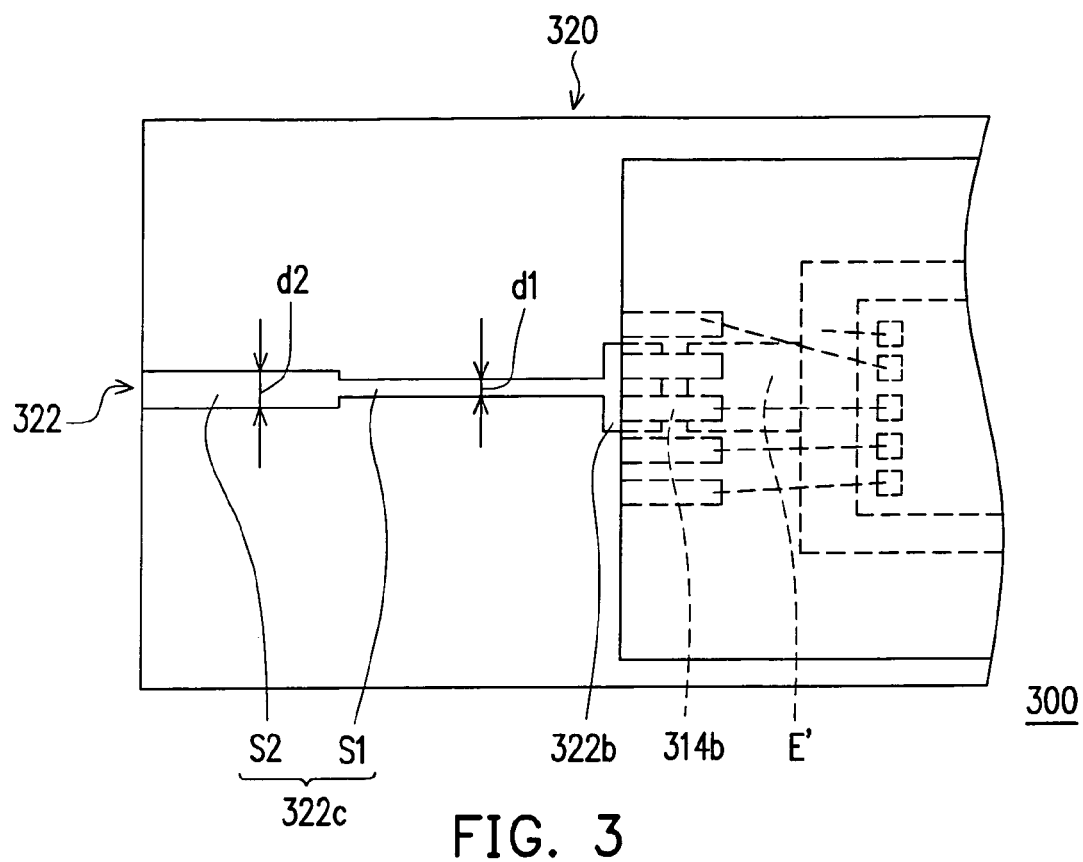
FIG. 3 is a schematic top view of an electronic assembly according to the second embodiment of the present invention.

Referring to FIGS. 3 and 2A, FIG. 3 is a schematic top view of an electronic assembly according to the second embodiment of the present invention. The difference between the second embodiment and the first embodiment is that in the electronic assembly 300 of the second embodiment, the transmission line 322c of the patterned conductive layer 322 of the circuit board 320 has a first section S1 and a second section S2, wherein the width d1 of the first section S1 is smaller than the width d2 of the second section S2, and the first section S1 is electrically connected to the second pad 322b.

As the width d1 of the first section S1 of the transmission line 322c electrically connected to the second pad 322b is smaller, when high-frequency signals of higher frequencies (for example, in a high-frequency region of 6-9 Giga-Hz) are transmitted, the increased induced inductance in the first section S1 of the transmission line 322c can be used to compensate the induced capacitance generated between the extension part E' and the two adjacent inner leads 314b electrically connected to the transmission line 322c, thereby achieving a desirable quality for the high-frequency signals with higher frequencies transmitted by the electronic assembly 300 of the second embodiment.

The Third Embodiment

Figure 4:
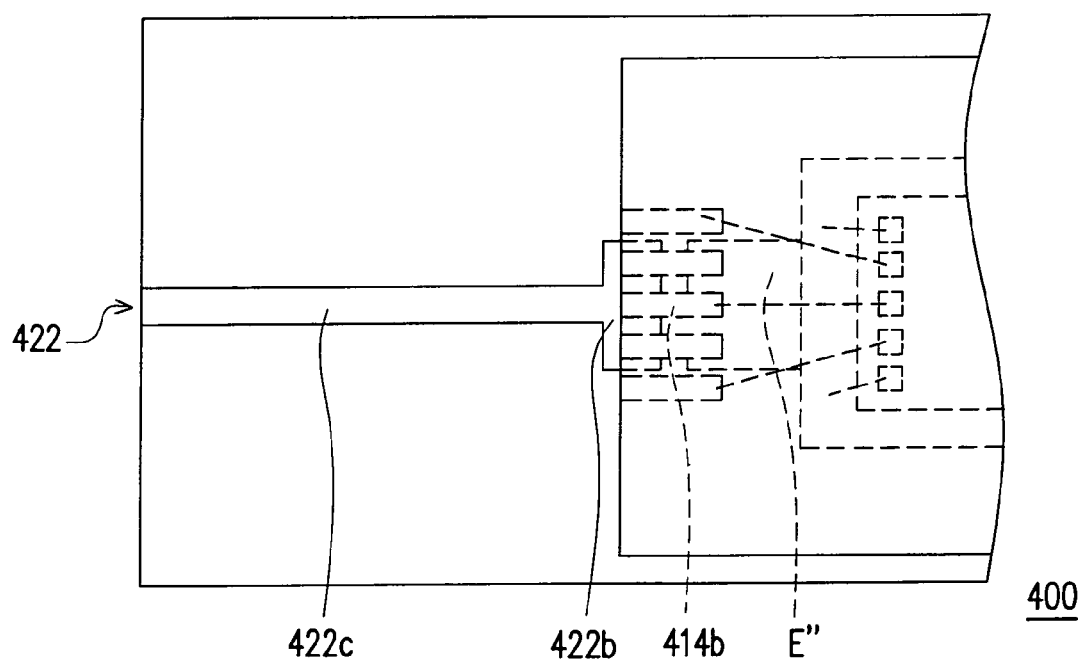
FIG. 4 is a schematic top view of an electronic assembly according to the third embodiment of the present invention.

Referring to FIGS. 4 and 2A, FIG. 4 is a schematic top view of an electronic assembly according to the third embodiment of the present invention. The difference between the third embodiment and the first embodiment is that in the electronic assembly 400 of the third embodiment, the second pad 422b of the patterned conductive layer 422 of the circuit board 420 is electrically connected to one end of three adjacent inner leads 414b. Besides, the other end of the adjacent inner leads 414b electrically connected to the second pad 422b has a projection at least partially overlapping the extension part E" of the first pad (not shown) on the patterned conductive layer 422. In other words, the extension part E" extends beneath the other end of the three adjacent inner leads 414b electrically connected to the second pad 422b. It should be mentioned that the number of inner leads 414b electrically connected to the second pad 422b and partially overlapping the extension part E" of the first pad can be varied according to the design requirements; therefore, the third embodiment is used as an example, and is not intended to limit the present invention.

Compared with the first embodiment, there are more inner leads 414b being electrically connected to the second pad 422b and partially overlapping the extension part E" of the first pad in the third embodiment, when the electronic assembly 400 of the third embodiment and the electronic assembly 200 of the first embodiment are used to transmit high-frequency signals with the same frequency e.g., in the high frequency range of 1-5 Giga-Hz, the signals transmitted by the electronic assembly 400 of the third embodiment have better quality.

Referring to FIGS. 3 and 4, it should be noted that the appearance of the transmission line 422c of the third embodiment can be designed as the appearance of the transmission line 322c of the second embodiment according to specific design requirements; therefore, when high-frequency signals in a high-frequency region, for example, between 4 Giga-Hz and 6 Giga-Hz are transmitted, the signals transmitted by the electronic assembly 400 of the third embodiment have a better quality. Due to the same reason as that of the second embodiment, the detail will not be repeated herein.

Finally, it should be emphasized that the frequency regions of the high-frequency signals mentioned in the above three embodiments are only used for illustrating the difference between the frequency regions of the high-frequency signals transmitted in the embodiments. The frequency regions can be varied along with the variation of the layout design of the patterned conductive layer of the circuit board and the change in the number of the inner leads of the chip package. Therefore, the frequency regions of high-frequency signals mentioned in the embodiments are only used as examples, and are not intended to limit the present invention.

In view of the above, the electronic assembly of the present invention at least has the following advantages:

(1) When the electronic assembly of the present invention is used to transmit high-frequency signals, the impedance mismatch caused by the induced inductance generated by the bonding wires can be compensated by the induced capacitance between the extension part of the first pad and the inner leads electrically connected to the transmission line, thereby increasing the return loss and reducing the insertion loss of the signal transmission between the transmission line and the inner leads electrically connected thereto;

(2) The electronic assembly of the present invention can be used to compensate the above induced capacitance via the proper inductance generated by varying the width of the transmission line; therefore, when the electronic assembly of the present invention is used to transmit signals with a higher frequency, the return loss of the signal transmission between the transmission line and the inner leads electrically connected thereto is further increased and the insertion loss is further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, suitable for being electrically connected to a chip package, wherein the chip package has a chip, a chip pad and a plurality of inner leads, and the chip pad and some of the inner leads are electrically connected to the chip via a plurality of bonding wires, the circuit board comprising:
a patterned conductive layer with at least one first pad and at least one second pad, wherein the first pad has an extension part and is electrically connected to the chip pad, and the second pad is electrically connected to one end of at least one of the inner leads and the other end of the inner lead being electrically connected to the second pad has a projection at least partially overlapping the extension part on the patterned conductive layer, and therefore compensating for impedance mismatch caused by bonding wire inductance; and a first insulating layer, wherein the patterned conductive layer is disposed outside the first insulating layer.

2. The circuit board as claimed in claim 1, wherein the patterned conductive layer includes a transmission line with one end being electrically connected to the second pad.

3. The circuit board as claimed in claim 2, wherein the transmission line has a first section and a second section, the width of the first section is smaller than that of the second section, and the first section is electrically connected to the second pad.

4. The circuit board as claimed in claim 1, wherein the first pad is a ground pad.

5. The circuit board as claimed in claim 1, wherein the second pad is a signal pad.

6. The circuit board as claimed in claim 1, wherein the second pad is suitable for being electrically connected to at least two adjacent inner leads of the chip package, and the other end of the adjacent inner leads suitable for being electrically connected to the second pad has a projection at least partially overlapping the extension part on the patterned conductive layer.

7. The circuit board as claimed in claim 1, further comprising a second insulating layer disposed on the patterned conductive layer, wherein the second insulating layer has at least one opening for exposing the first and second pads.

8. An electronic assembly, comprising:
a chip package, comprising:

a chip, having an active surface and a plurality of bonding pads disposed on the active surface;

a lead frame, having a chip pad and a plurality of inner leads, wherein the chip is disposed on the chip pad;

a plurality of bonding wires, wherein the chip pad and some of the inner leads are electrically connected to the bonding pads via the bonding wires; and an encapsulant, encapsulating the chip, the bonding wires, and a part of the lead frame; and a circuit board with the chip package being disposed thereon, comprising: a patterned conductive layer, having at least one first pad and at least one second pad, wherein the first pad has an extension part and is electrically connected to the chip pad; the second pad is electrically connected to one end of at least one of the inner leads, and the other end of the inner lead electrically connected to the second pad has a projection at least partially overlapping the extension part on the patterned conductive layer, and therefore compensating for impedance mismatch caused by bonding wire inductance; and a first insulating layer, wherein the patterned conductive layer is disposed outside the first insulating layer.

9. The electronic assembly as claimed in claim 8, wherein the patterned conductive layer includes at least one transmission line with one end being electrically connected to the second pad.

10. The electronic assembly as claimed in claim 9, wherein the transmission line has a first section and a second section, the width of the first section is smaller than that of the second section, and the first section is electrically connected to the second pad.

11. The electronic assembly as claimed in claim 8, wherein the chip package is one with a quad flat no-lead (QFN) package configuration.

12. The electronic assembly as claimed in claim 8, wherein the first pad is a ground pad.

13. The electronic assembly as claimed in claim 8, wherein the second pad is a signal pad.

14. The electronic assembly as claimed in claim 8, wherein the second pad is suitable for being electrically connected to at least two adjacent inner leads of the chip package, and the other end of the adjacent inner leads suitable for being electrically connected to the second pad has a projection at least partially overlapping the extension part on the patterned conductive layer.

15. The electronic assembly as claimed in claim 14, wherein one of the adjacent inner leads electrically connected to the second pad is electrically connected to one of the bonding pads via one of the bonding wires.

16. The electronic assembly as claimed in claim 8, further comprising a second insulating layer disposed on the patterned conductive layer, wherein the second insulating layer has at least one opening for exposing the first and second pads.

* * * * *